(12) United States Patent
Schneider et al.

(10) Patent No.: US 6,469,355 B1
(45) Date of Patent: Oct. 22, 2002

(54) CONFIGURATION FOR VOLTAGE BUFFERING IN A DYNAMIC MEMORY USING CMOS TECHNOLOGY

(75) Inventors: Helmut Schneider, München; Martin Zibert, Feldkirchen-Westerham, both of (DE)

(73) Assignee: Infineon Technologies AG, Munich (DE)

( * ) Notice: Subject to any disclaimer, the term of this patent is extended or adjusted under 35 U.S.C. 154(b) by 29 days.

(21) Appl. No.: 09/671,452

(22) Filed: Sep. 27, 2000

(30) Foreign Application Priority Data

Sep. 27, 1999 (DE) .......................... 199 46 201

(51) Int. Cl.[7] .............................. H01L 29/72
(52) U.S. Cl. ............... 257/369; 257/371; 257/372; 257/544; 257/546; 257/551; 365/189; 326/50; 326/80; 326/81

(58) Field of Search ................... 257/369, 371, 257/372, 544, 546, 551; 365/189; 326/50, 81, 80

(56) References Cited

U.S. PATENT DOCUMENTS 5,641,986 A    6/1997  Uchida
5,805,508 A  * 9/1998  Tobita ................. 257/369

* cited by examiner

Primary Examiner—Edward Wojciechowicz
(74) Attorney, Agent, or Firm—Laurence A. Greenberg; Werner H. Stemer; Ralph E. Locher

(57) ABSTRACT

A configuration for voltage buffering in dynamic memories based on CMOS technology uses the capacitance of a well structure for buffering the amplified word line voltage or the negative word line reverse voltage.

6 Claims, 1 Drawing Sheet

CONFIGURATION FOR VOLTAGE BUFFERING IN A DYNAMIC MEMORY USING CMOS TECHNOLOGY

BACKGROUND OF THE INVENTION

1. Field of the Invention

The invention relates to a configuration for voltage buffering in dynamic memories using CMOS technology.

In DRAMs (dynamic random access memories), capacitive voltage buffering is required as a storage reservoir in particular for an amplified or boosted word line voltage ("word line booster") $V_{PP}$, an internal regulated supply voltage $V_{DD}$ and a negative word line reverse voltage NWLL. This voltage buffering should save as much space as possible in order to save chip area. Despite considerable efforts, this aim has not been achieved heretofore. Thus, the various voltages required in DRAMs are currently buffered for the purpose of stabilization with the aid of MOS capacitances, for which the gate oxide is preferably used, and/or memory cells in the trench or stack. As a general rule additional, separate chip area is used for this purpose, which is contrary to the goal of a space-spacing voltage buffering.

SUMMARY OF THE INVENTION

It is accordingly an object of the invention to provide a configuration for voltage buffering in dynamic memories using CMOS technology which overcomes the above-mentioned disadvantages of the heretofore-known configurations of this general type and which provides sufficient buffer capacitances without requiring additional space on the chip.

With the foregoing and other objects in view there is provided, in accordance with the invention, a configuration for voltage buffering in a dynamic memory using CMOS technology, including:

a p-conducting semiconductor substrate to be connected to a low supply voltage for supplying a first voltage thereto;

an n-conducting well structure provided in the p-conducting semiconductor substrate, the n-conducting well structure to be connected to a high supply voltage for supplying a second voltage thereto and being supplied with a given voltage to be buffered;

a p-conducting semiconductor region enclosed by the n-conducting well structure, the the p-conducting semiconductor region being supplied with a third voltage, the second voltage being higher than the first voltage and the third voltage; and an NMOS transistor provided in the p-conducting semiconductor region.

In accordance with another feature of the invention, the n-conducting well structure is supplied with a negative word line reverse voltage as the given voltage to be buffered.

In accordance with yet another feature of the invention, the n-conducting well structure is supplied with an amplified word line voltage as the given voltage to be buffered.

In accordance with a further feature of the invention, a further well structure and a further transistor enclosed by the further well structure are provided, the n-conducting well structure and the further well structure being connected in parallel.

The invention can also be realized using the respectively inverted conduction types, such that the configuration for voltage buffering includes:

an n-conducting semiconductor substrate to be connected to a high supply voltage for supplying a first voltage thereto;

a p-conducting well structure provided in the n-conducting semiconductor substrate, the p-conducting well structure to be connected to a low supply voltage for supplying a second voltage thereto and being supplied with a given voltage to be buffered;

an n-conducting semiconductor region enclosed by the p-conducting well structure, the n-conducting semiconductor region being supplied with a third voltage, the second voltage being lower than the first voltage and the third voltage; and a PMOS transistor provided in the n-conducting semiconductor region.

In other words, the object of the invention is achieved by the n-conducting well structure having a higher voltage applied to it than the p-conducting semiconductor region or the p-conducting semiconductor substrate and, to that end, the semiconductor substrate is connected to a low supply voltage $V_{SS}$ and the n-conducting well structure is connected to a high supply voltage, with the result that a voltage to be buffered can be applied to the n-conducting well structure. The voltage to be buffered is preferably the negative word line reverse voltage or the amplified or boosted word line voltage. Through the use of suitable circuit connections of the well structure, of the semiconductor substrate surrounding the well structure, and of the semiconductor region surrounded by the well structure, it is thus possible to use the large-area junction capacitances, provided by the well structure and the semiconductor substrate or by the well structure and the semiconductor region, underneath the NPN transistor in an extremely space-saving manner, in order to produce the necessary buffer capacitances. The only prerequisite for this is that a higher voltage is applied to the n-conducting well structure than to the p-conducting semiconductor region or to the p-conducting semiconductor substrate.

As described above, the invention can also be realized using the respectively inverted conduction types. In this case, a lower voltage must then be applied to the p-conducting well structure than to the n-conducting semiconductor region or the n-conducting semiconductor substrate.

The invention thus makes it possible to buffer different voltages with respect to one another without taking up additional chip area.

The main areas of application of the configuration according to the invention can be summarized as follows:

(a) In DRAMs driven by NMOS selection transistors, a large capacitive voltage reservoir of a boosted or increased word line voltage ($V_{PP}$) in excess of the operating voltage is generally required in order to be able to rapidly ensure a required activation of the word line. For this purpose, use is currently made of MOS transistors or separate cell array structures with corresponding storage capacitances, but these require additional chip area and, moreover, their efficacy and reliability is limited by possible short circuits. The invention provides an outstanding remedy here: the capacitance which is present as a result of the well structure and which constitutes a junction diode capacitance for which an oxide breakdown is not possible is used without additionally taking up chip area underneath the NMOS field-effect transistors that are present in any case. Short circuits are not to be expected and consequently the reliability is high. Moreover, as has already been mentioned, no additional chip area is required.

(b) The invention may be used especially in the case of the "negative word line low" technique (technique in which a negative word line is at low voltage) that will probably be used in the future, and in which word lines in the switched-off state are not pulled to ground $V_{SS}$ but rather are at a negative voltage value. Here, in order to improve the off state of the NMOS selection transistors, it is possible, due to the insulated NMOS field-effect transistors which are required in the row decoder, to use the well structure of the transistors for the required support of the ground buffering.

As will be explained in more detail further below with reference to an exemplary embodiment, standard NMOS field-effect transistors can be provided in insulated semiconductor regions, even in existing configurations. Their buried well structures then serve as buffers wherein an extremely small space is taken up for the implantation of a connection region ("WN implantation") all around the n-conducting well structure.

(c) Quite generally it is also possible to provide the on-chip supply voltage $V_{DD}$ or any other generator voltage under insulated NMOS field-effect transistors, in order to increase the stabilization.

Other features which are considered as characteristic for the invention are set forth in the appended claims.

Although the invention is illustrated and described herein as embodied in a configuration for voltage buffering in dynamic memories using CMOS technology, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
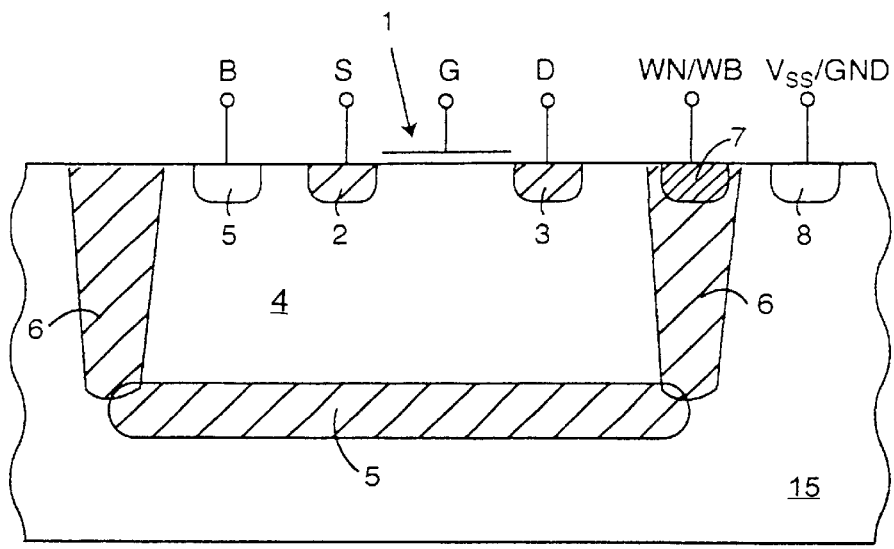
FIG. 1 is a diagrammatic, partial sectional view of an NMOS field-effect transistor in an n-conducting well structure for illustrating the invention.

Referring now to the figures of the drawings in detail and first, particularly, to FIG. 1 thereof, there is shown a sectional view of an NMOS field-effect transistor 1 having an n⁺-conducting source zone 2, an n⁺-conducting drain zone 3, a source electrode S, a drain electrode D and a gate electrode G. This NMOS field-effect transistor 1 is provided in an insulated p⁻-conducting semiconductor region 4, which is also referred to as "bulk". This p⁻-conducting semiconductor region 4 has a p⁺-conducting contact zone 5 with a bulk electrode B. The semiconductor region 4 is enclosed in an n⁻-conducting well structure 5, 6 including a buried layer 5 and deep diffusions 6, the well structure 5, 6 being provided with an n⁻-conducting connection zone 7 with an electrode WN/WB. The well structure 5, 6 is, for its part, embedded in a p-conducting semiconductor substrate 15 having a p⁺-conducting connection zone 8, at which a low supply voltage $V_{SS}$ or ground GND is present.

Figure 2:
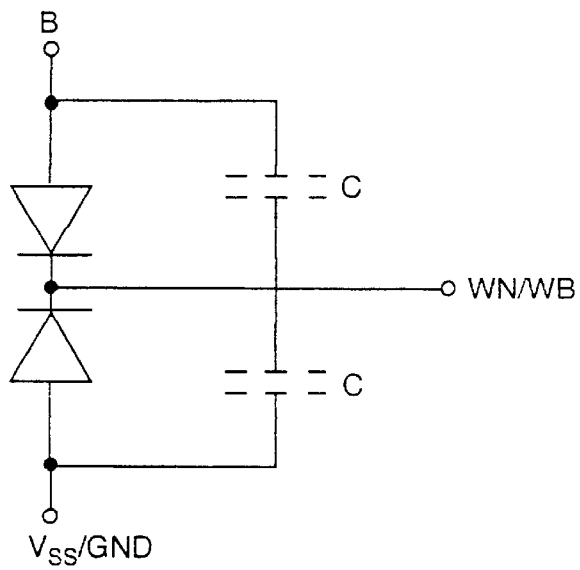
FIG. 2 is an equivalent circuit diagram for the configuration of FIG. 1.

The well structure 5, 6 forms pn junctions with the semiconductor region 4 and with the semiconductor substrate 15, respectively. These pn junctions are reverse-biased if a higher voltage is present at the well structure 5, 6 than at the semiconductor region 4 and at the semiconductor substrate 15, respectively. In this case, the pn junctions act as capacitances C, as is evident from the equivalent circuit diagram of FIG. 2.

By virtue of the configuration according to the invention, these capacitances can advantageously be utilized for buffering generator voltages in DRAMs. Examples of such buffered voltages are the on-chip supply voltage $V_{DD}$, the amplified word line voltage $V_{PP}$ or the negative word line reverse voltage NWLL.

Figure 3:
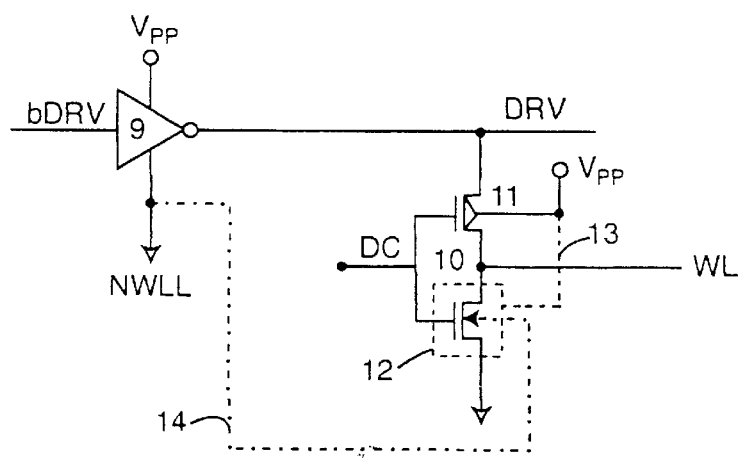
FIG. 3 is a circuit diagram of a concrete exemplary application of the configuration according to the invention.

FIG. 3 shows an example of the buffering of the voltage NWLL. A word line WL is connected via a word line switch 9, which supplies a driver voltage DRV, to a driver 10 including a PMOS transistor 11 and an NMOS transistor 12. Gates of the transistors 11, 12 are connected to a word line decoder DC. The semiconductor region ("bulk") of the PMOS field-effect transistor 11 is at the raised word line voltage $V_{PP}$. This voltage $V_{PP}$ is also applied to the well structure 5, 6 of the NMOS transistor 12, as is indicated by a broken line 13. In practice, this can be done in a simple manner by the n-conducting semiconductor region ("bulk") of the PMOS field-effect transistor 11 being connected for example to the configuration shown in FIG. 1, on the left-hand side thereof, with the deep diffusion zone 6 that is illustrated on the left there being dispensed with.

It is of crucial importance, then, that the negative word line reverse voltage NWLL across the word line switch 9 is also additionally applied to the semiconductor region 4 ("bulk") of the NMOS field-effect transistor 12, as is indicated by a dash-dotted line 14. This means that, in an extremely space-saving manner, the junction capacitance of the well structure 5, 6 of the NMOS field-effect transistor 12 and, in addition, the junction capacitance of the PMOS field-effect transistor 11 can be utilized for buffering the negative word line reverse voltage NWLL.

We claim:

1. A configuration for voltage buffering in a dynamic memory using CMOS technology, comprising:

a driver;

a PMOS transistor in said driver;

a NMOS transistor in said driver;

a p-conducting semiconductor substrate to be connected to a low supply voltage for supplying a first voltage thereto;

an n-conducting well structure provided in said p-conducting semiconductor substrate, said n-conducting well structure to be connected to a high supply voltage for supplying a second voltage thereto;

a p-conducting semiconductor region enclosed by said n-conducting well structure, said p-conducting semiconductor region being supplied with a third voltage; and a semiconductor bulk region of said PMOS transistor being supplied with the second voltage;

said NMOS transistor being provided in said p-conducting semiconductor region; and said n-conducting well structure and said bulk region of said PMOS transistor being connected in parallel;

said p-conducting semiconductor bulk region being connected to a negative word line reverse voltage for supplying the third voltage thereto for voltage buffering; and the second voltage being higher than said first voltage and the third voltage.

2. The configuration according to claim 1, wherein said n-conducting well structure is supplied with a negative word line reverse voltage as the given voltage to be buffered.

3. The configuration according to claim 1, wherein said n-conducting well structure is supplied with an amplified word line voltage as the given voltage to be buffered.

4. The configuration according to claim 1, including a further well structure and a further transistor enclosed by said further well structure, said n-conducting well structure and said further well structure being connected in parallel.

5. A configuration for voltage buffering in a dynamic memory using CMOS technology, comprising:
   a driver;
   a PMOS transistor in said driver;
   a NMOS transistor in said driver;
   an n-conducting semiconductor substrate to be connected to a high supply voltage for supplying a first voltage thereto;
   a p-conducting well structure provided in said n-conducting semiconductor substrate, said p-conducting well structure to be connected to a low supply voltage for supplying a second voltage thereto;
   an n-conducting semiconductor region enclosed by said p-conducting well structure, said n-conducting semiconductor region being supplied with a third voltage;
   a semiconductor bulk region of said NMOS transistor being supplied with the second voltage;
   said PMOS transistor provided in said n-conducting semiconductor region; and
   said p-conducting well structure and said bulk region of said PMOS transistor being connected in parallel;
   said n-conducting semiconductor bulk region being connected to a negative work line reverse voltage for supplying the third voltage thereto for voltage buffering; and
   the second voltage being higher than the first voltage and the third voltage.

6. The configuration according to claim 5, including a further well structure and a further transistor enclosed by said further well structure, said p-conducting well structure and said further well structure being connected in parallel.

* * * * *